(12) United States Patent
Horiguchi

(10) Patent No.: US 8,832,407 B2
(45) Date of Patent: Sep. 9, 2014

(54) COMMUNICATION DEVICE WITH STORAGE FUNCTION

(75) Inventor: Tomoya Horiguchi, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 108 days.

(21) Appl. No.: 13/564,055

(22) Filed: Aug. 1, 2012

(65) Prior Publication Data

US 2013/0198470 A1 Aug. 1, 2013

Related U.S. Application Data

(63) Continuation of application No. PCT/JP2010/051438, filed on Feb. 2, 2010.

(51) Int. Cl.
*G06F 12/02* (2006.01)
*G06F 3/06* (2006.01)
*G11C 16/26* (2006.01)
*G11C 16/32* (2006.01)
*G11C 16/34* (2006.01)

(52) U.S. Cl.
CPC ............ *G06F 3/065* (2013.01); *G06F 12/0246* (2013.01); *G11C 16/26* (2013.01); *G11C 16/32* (2013.01); *G11C 16/349* (2013.01)
USPC .......................................................... 711/171

(58) Field of Classification Search
CPC ............................. G06F 12/08; G06F 12/0246
See application file for complete search history.

(56) References Cited

U.S. PATENT DOCUMENTS

| 8,488,570 | B2 * | 7/2013 | Imaeda | ......................... | 370/338 |
| 2013/0198247 | A1 * | 8/2013 | Horiguchi | ..................... | 707/822 |

FOREIGN PATENT DOCUMENTS

| JP | 5-100296 A | 4/1993 |
| JP | 10-134559 A | 5/1998 |
| JP | 2002-024167 A | 1/2002 |
| JP | 2008-508596 A | 3/2008 |
| JP | 2008-204623 A | 9/2008 |

OTHER PUBLICATIONS

English translation of IPRP dated Sep. 27, 2012 from PCT/JP2010/051438; 6 pages.
International Search Report dated Mar. 2, 2010 from PCT/JP2010/051438.

* cited by examiner

*Primary Examiner* — Hiep Nguyen
(74) *Attorney, Agent, or Firm* — Ohlandt, Greeley, Ruggiero & Perle, L.L.P.

(57) ABSTRACT

According to one embodiment, a communication device includes a data storage device and following units. The reception unit receives data and information indicating a size of the data. The data storage device includes a data area controlled by a file system and a temporary area beyond control of the file system. The determination unit determines whether the size is not larger than a predetermined threshold value. If it is determined that the size is not larger than the threshold value, the control unit writes the received data to the temporary area, copies the received data in the temporary area to the data area after completion of reception, and erases the received data in the temporary area after copying.

10 Claims, 7 Drawing Sheets

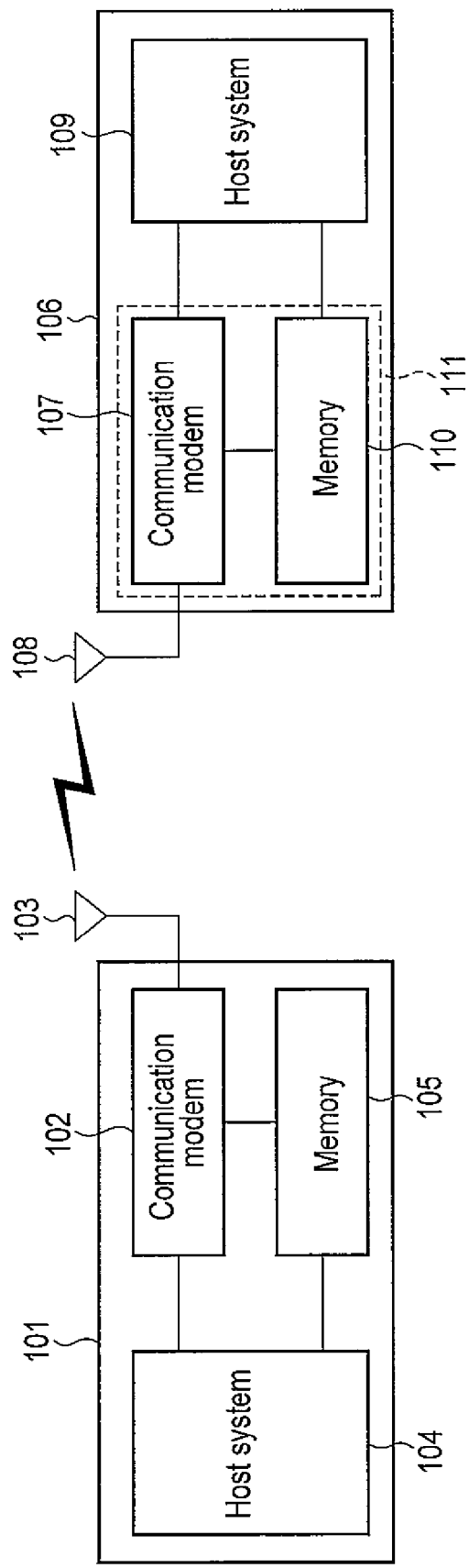
F I G. 1

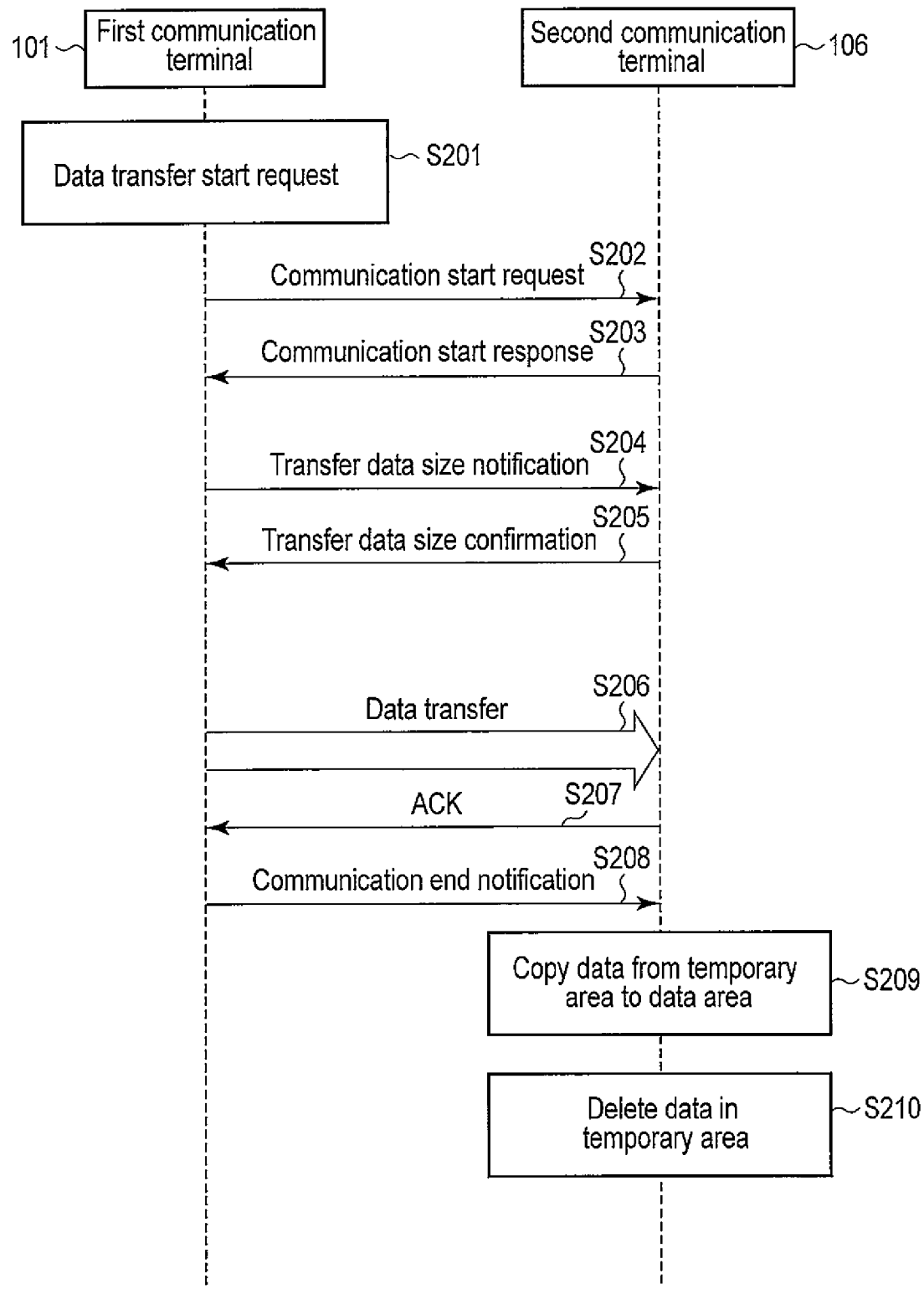
F I G. 2

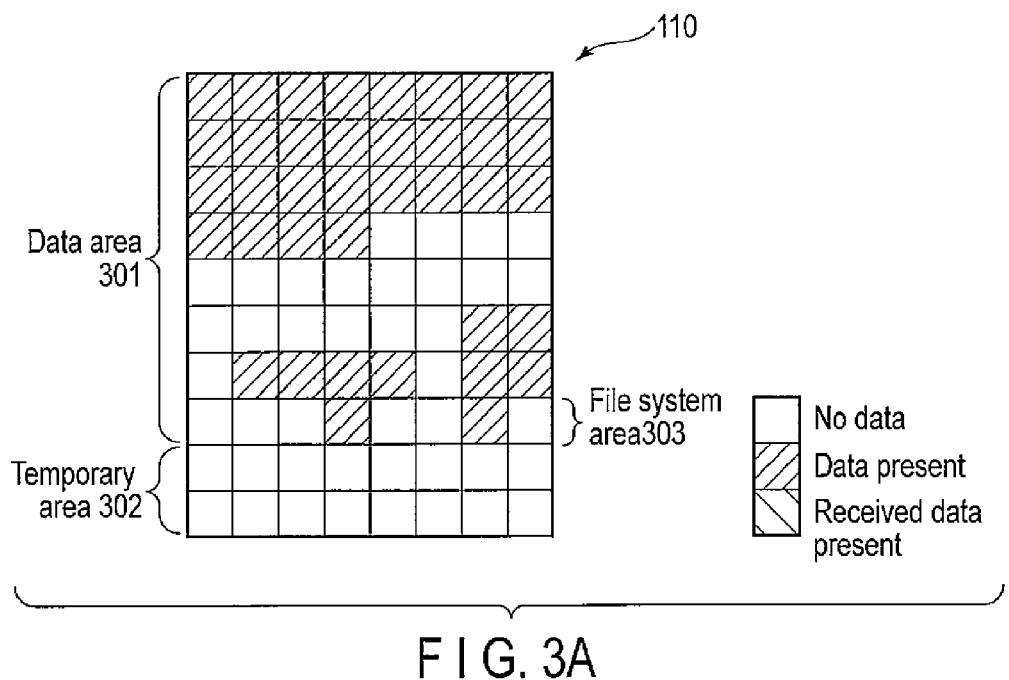
F I G. 3A
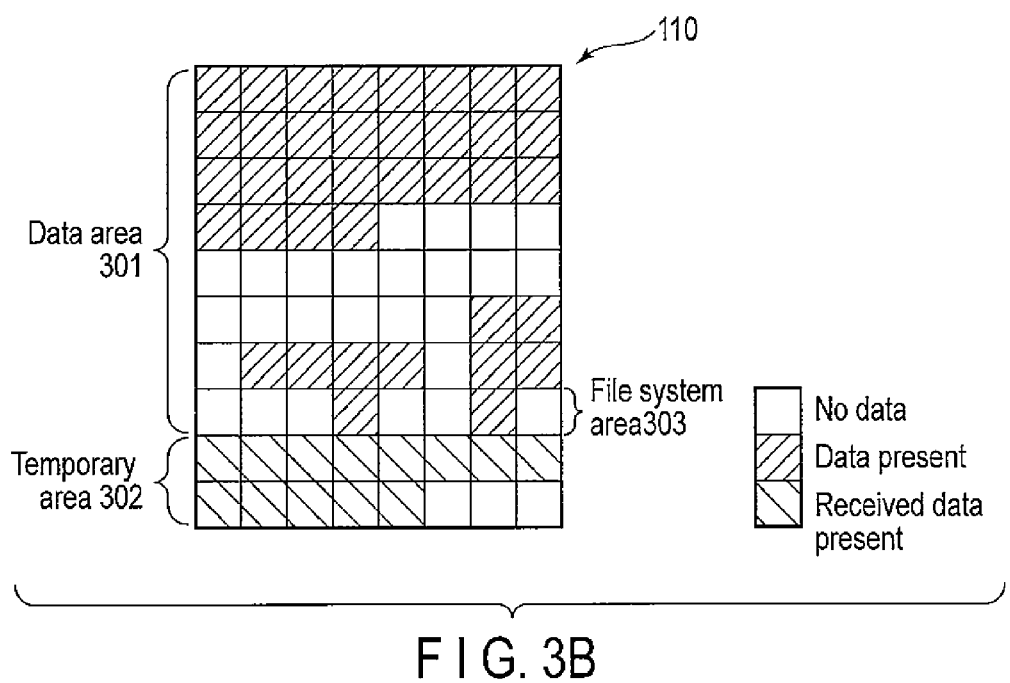
F I G. 3B

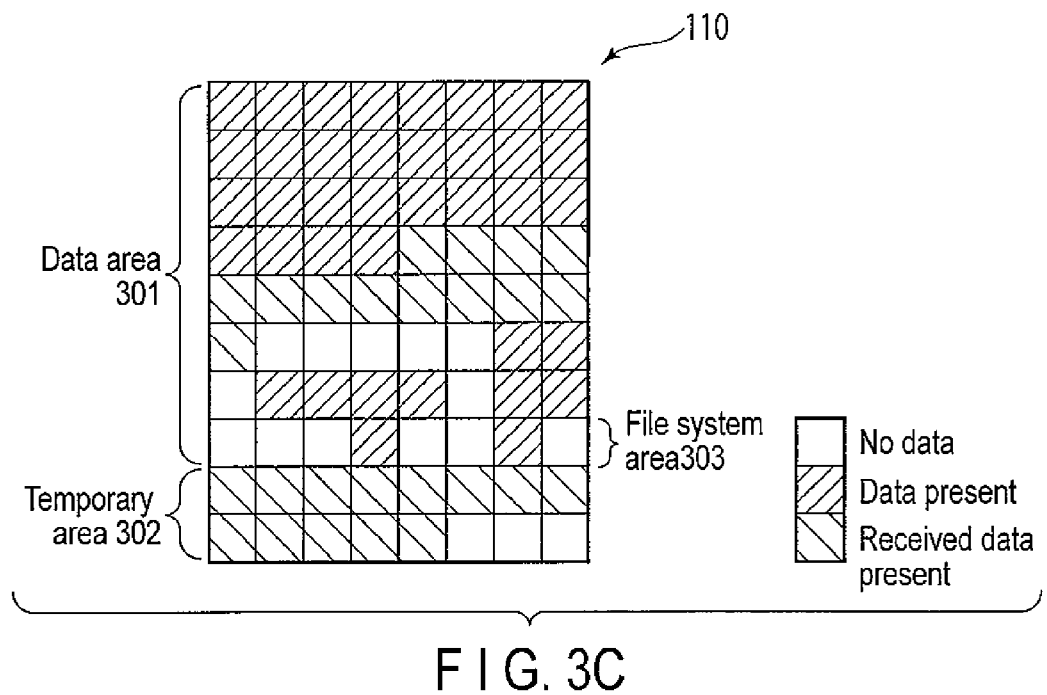
F I G. 3C
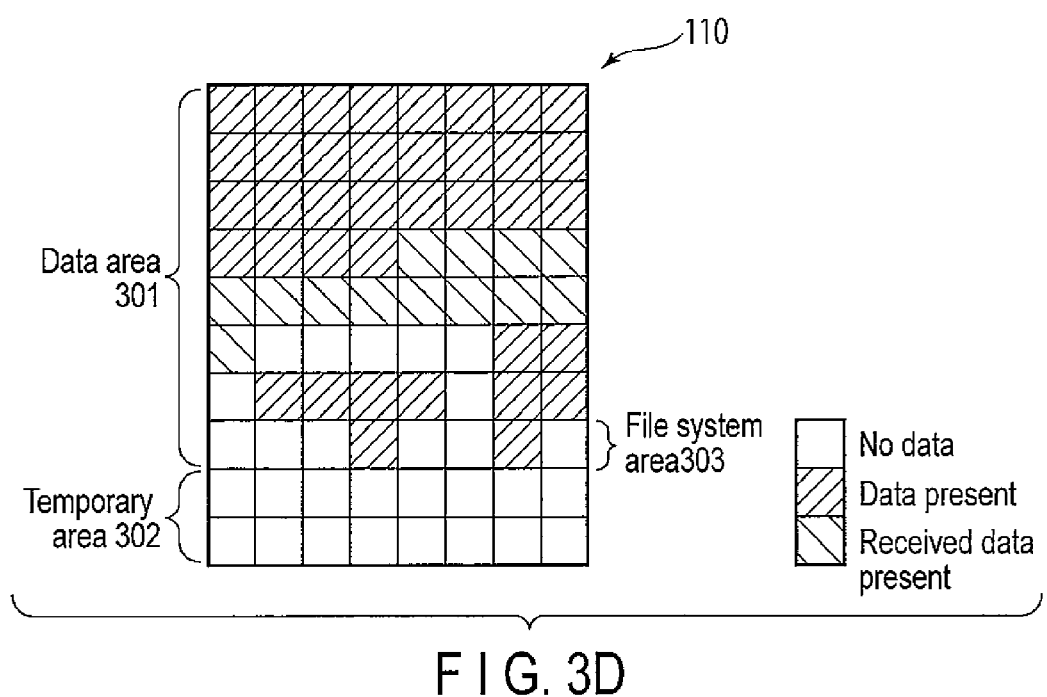
F I G. 3D

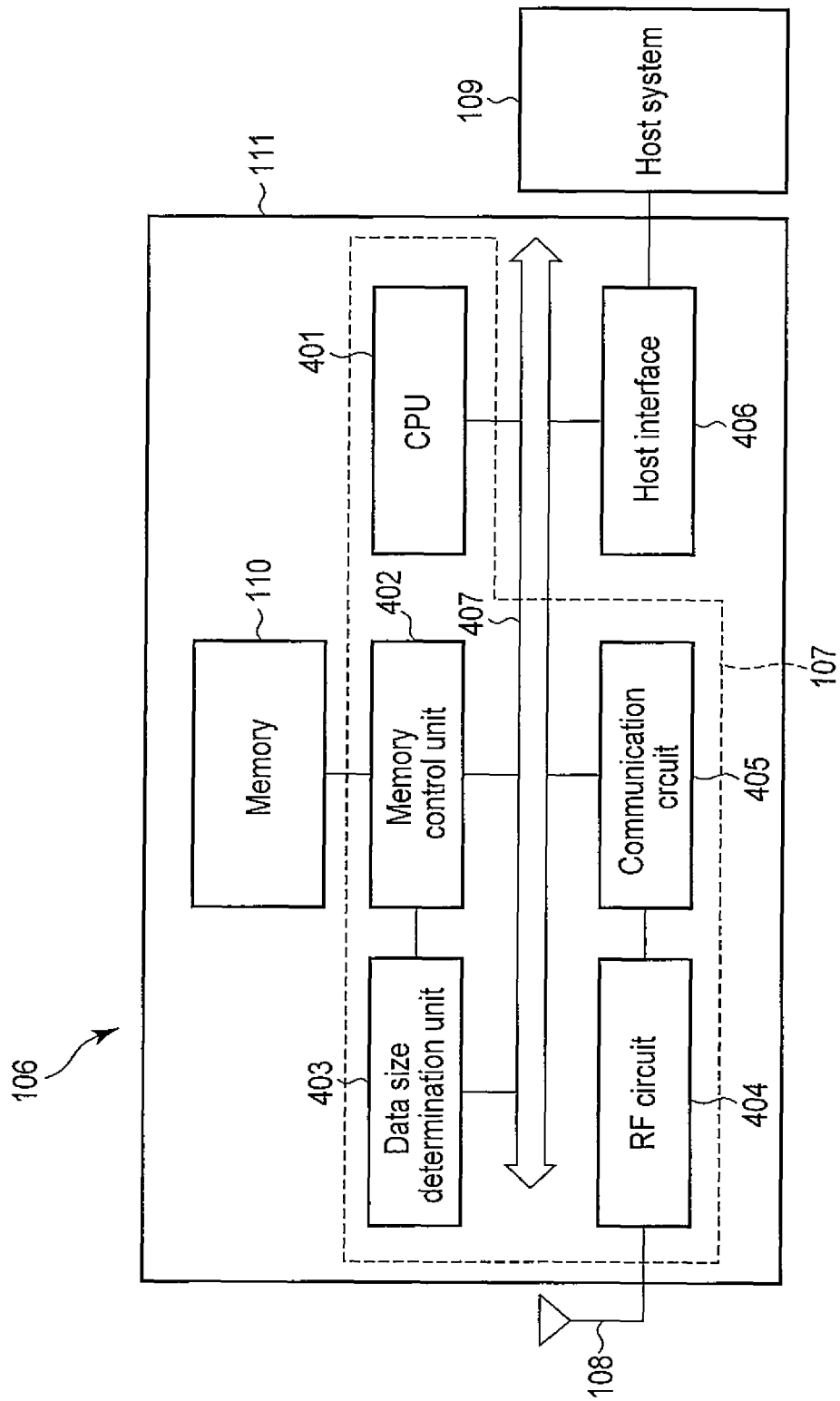
F I G. 4

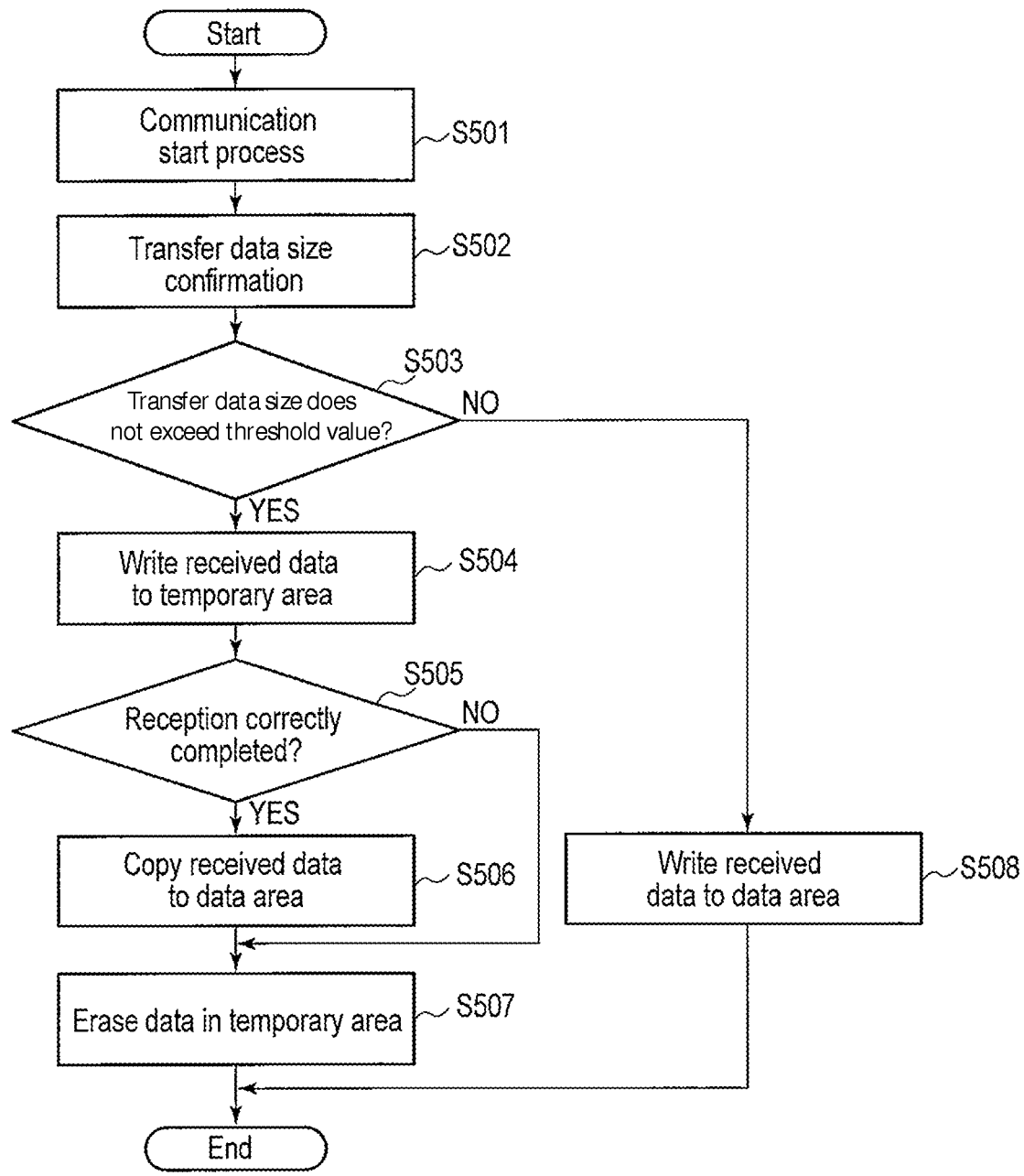
F I G. 5

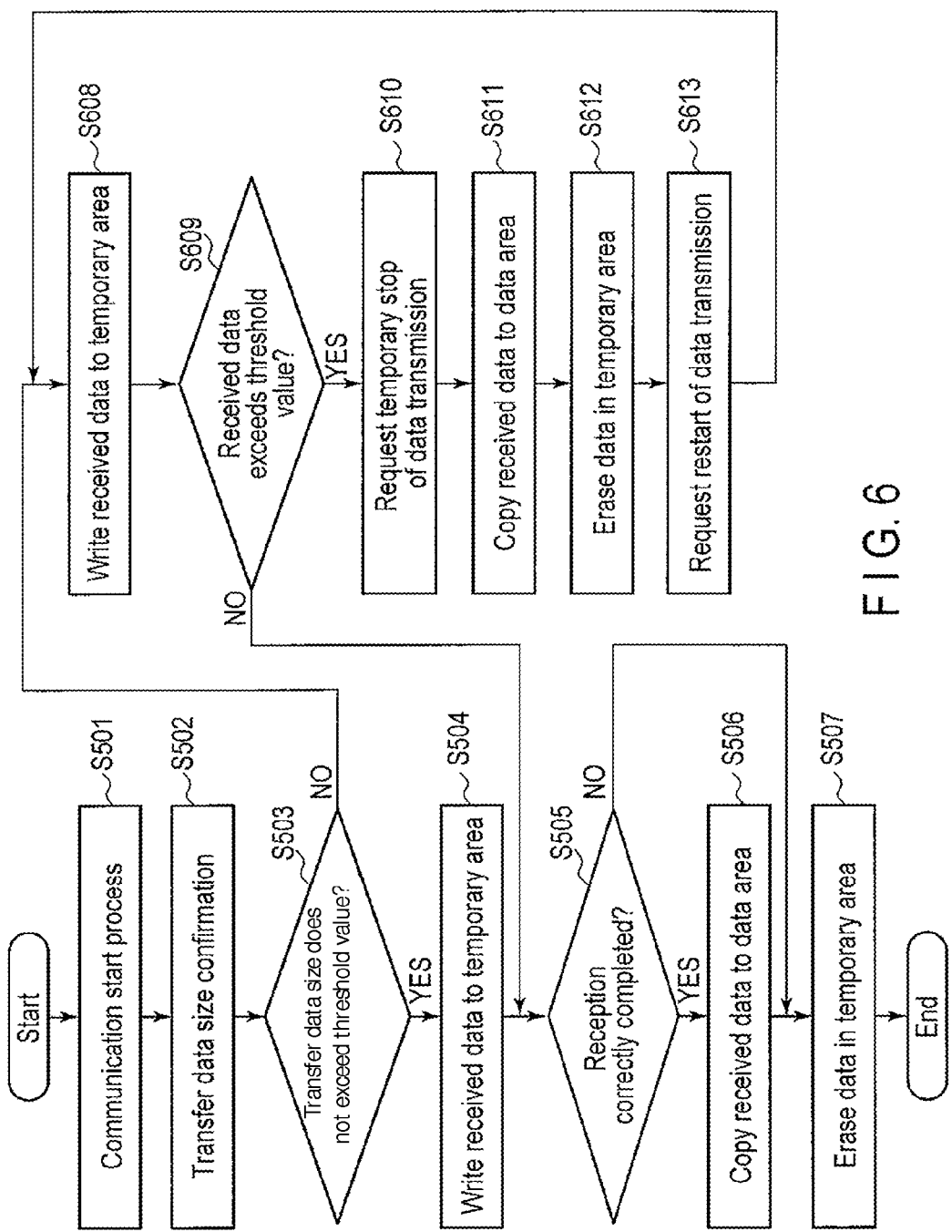
F I G. 6

COMMUNICATION DEVICE WITH STORAGE FUNCTION

CROSS REFERENCE TO RELATED APPLICATIONS

This application is a Continuation Application of PCT Application No. PCT/JP2010/051438, filed Feb. 2, 2010, the entire contents of which are incorporated herein by reference.

FIELD

Embodiments described herein relate generally to a wireless communication device with a data storage device.

BACKGROUND

A wireless communication device such as a mobile phone generally includes a nonvolatile memory as a data storage device. A NAND flash memory that is relatively inexpensive among the nonvolatile memories is often used as the nonvolatile memory mounted on the wireless communication device. In the NAND flash memory, when data is overwritten in an area to which data is already written, it is necessary to erase the data in the area before writing the new data. It is known that the throughput of data writing is greatly degraded because of the erase process. For example, the data writing speed in the NAND flash memory sometimes becomes lower than the data transfer rate between wireless communication devices. In this case, it is necessary to provide a temporary buffer of large capacity that stores the received data during the data-erase waiting time in a wireless communication device on the data reception side.

As the technique for increasing the data writing speed in the flash memory, for example, a method that uses a plurality of buffer memories with respect to a main memory is disclosed in JP-A 2008-204623 (KOKAI). Further, a method for providing an extra area in a memory is disclosed in JP-A 10-134559 (KOKAI).

However, in JP-A 2008-204623 (KOKAI), there occurs a problem that the circuit size is increased and the power consumption and cost are increased since it is necessary to prepare a plurality of buffer memories. Further, in JP-A 10-134559 (KOKAI), since it is necessary to provide a large extra area in the memory and perform preprocessing at the data write time, there occurs a problem that the latency until writing is started becomes long. Therefore, the communication device is required to have short latency until writing is started and to receive data at high speed even with a small circuit size.

BRIEF DESCRIPTION OF THE DRAWINGS

FIG. 1 is a block diagram showing a communication system according to a first embodiment.

FIG. 2 is a flowchart showing one example of a data transfer process in the communication system shown in FIG. 1.

FIGS. 3A, 3B, 3C, and 3D are explanatory diagrams illustrating the operation of a memory shown in FIG. 1.

FIG. 4 is a block diagram more specifically showing a communication terminal shown in FIG. 1.

FIG. 5 is a flowchart showing one example of a data reception process in the communication terminal shown in FIG. 4.

FIG. 6 is a flowchart showing one example of a data reception process in a communication terminal according to a second embodiment.

DETAILED DESCRIPTION

In general, according to one embodiment, a communication device includes a reception unit, a data storage device, a data storage device, a determination unit, and a control unit. The reception unit is configured to receive, from another communication device, data and information indicating a size of the data. The data storage device includes a data area controlled by a file system and a temporary area which is beyond control of the file system, the temporary area being allocated a fixed logical address. The determination unit is configured to determine whether the size of the data is not larger than a predetermined threshold value. The control unit is configured to, if it is determined that the size of the data is not larger than the threshold value, write the received data to the temporary area, copy the received data in the temporary area to the data area after completion of reception, and erase the received data in the temporary area after copying.

One embodiment provides a communication device with a small circuit size which realizes high-speed data communication.

Hereinafter, communication devices according to various embodiments will be described with reference to the accompanying drawings. In the embodiments, like reference numbers denote like elements, and duplication of explanation will be avoided.

(First Embodiment)

FIG. 1 schematically shows the configuration of a communication system according to a first embodiment. As shown in FIG. 1, the communication system includes communication terminals (also referred to as communication devices) 101 and 106 which perform peer-to-peer communication according to a predetermined wireless communication system. The communication terminals 101 and 106 respectively include communication modems 102 and 107, antennas 103 and 108, host systems 104 and 109, and memories 105 and 110 used as data storage devices. For communication between the communication terminals 101 and 106, any type of wireless communication system can be used.

In the present embodiment, explained is an example in which data is transferred from the communication terminal 101 to the communication terminal 106. In the following description, the communication terminal 101 on the data transmission side is referred to as a first communication terminal and the communication terminal 106 on the data reception side is referred to as a second communication terminal. The communication device according to the present embodiment corresponds to the communication terminal on the reception side, that is, second communication terminal 106. In the second communication terminal 106, a communication/storage unit 111 including the communication modem 107 and memory 110 is shown in a simplified form in FIG. 1 and will be explained in detail later with reference to FIG. 4. Since the first communication terminal 101 can be formed with the same configuration as the second communication terminal 106, the detailed explanation thereof is omitted.

The host system 104 of the first communication terminal 101 is connected to the communication modem 102 and memory 105 via an interface (not shown). In the present embodiment, assumed as the host system 104 is, for example, a CPU or the like of a notebook-size personal computer (PC), personal digital assistance (PDA) or mobile phone.

When data is transferred to the second communication terminal 106, the host system 104 writes, to the memory 105, data to be transmitted to the second communication terminal 106. The communication modem 102 reads, from the memory 105, the data to be transmitted to the second communication terminal 106 according to an instruction of the host system 104. The communication modem 102 generates a data signal from the read data by signal processing for wireless communication. The communication modem 102 transmits the data signal via the antenna 103. Further, as will be described later, the communication modem 102 transmits various signals (for example, communication start request, transfer data size notification, communication end notification and the like) to the second communication terminal 106 and receives various signals (for example, communication start response, transfer data size confirmation, acknowledge (ACK) packet and the like) from the second communication terminal 106.

The host system 109 of the second communication terminal 106 is connected to be communicable with the communication/storage unit 111 via a host interface 406 shown in FIG. 4. In the present embodiment, assumed as the host system 109 is, for example, a CPU of a notebook-size PC, PDA, mobile phone, or the like.

The communication modem 107 of the second communication terminal 106 receives a data signal from the first communication terminal 101 via the antenna 108. The communication modem 107 generates data from the received data by signal processing for wireless communication. The communication modem 107 writes the data to the memory 110. Further, the communication modem 107 receives various signals (for example, communication start request, transfer data size notification, communication end notification and the like) from the first communication terminal 101 and transmits various signals (for example, communication start response, transfer data size confirmation, ACK packet and the like) to the first communication terminal 101.

As will be described later, the memory 110 is previously partitioned into a data area and temporary area by using a logical address. In this case, the logical address is used when data is read and written, and does not necessarily coincide with a physical address indicating one of memory cells in the memory 110 to which data is to be written.

In the present embodiment, the communication modem 107 writes the generated data to one of the temporary area and data area in the memory 110 according to the size thereof. The size of data transmitted by the first communication terminal 101 is notified from the first communication terminal 101 to the second communication terminal 106 before data communication. The communication modem 107 of the second communication terminal 106 determines whether the notified data size is not larger than a predetermined threshold value. If the size of data to be received is not larger than the threshold value, the received data, which is obtained by the communication modem 107, is written to the temporary area of the memory 110. If the received data is written to the temporary area, the received data stored in the temporary area is copied to the data area after data reception is completed and then the data in the temporary area is erased. On the other hand, if the data size is larger than the threshold value, the received data obtained by the communication modem 107 is written to the data area of the memory 110.

When a series of reception processes described above is completed, the communication modem 107 notifies the host system 109 about completion of the reception process. After receiving the notification indicating completion of the reception process from the communication modem 107, the host system 109 accesses the data area in the memory 110 to use data written to the data area of the memory 110.

FIG. 2 shows one example of a procedure for transferring data from the first communication terminal 101 to the second communication terminal 106. In FIG. 2, it is assumed that the size of data transmitted by the first communication terminal 101 is smaller than the size of the temporary area allocated to the memory 110 of the second communication terminal 106.

As shown in FIG. 2, first, a data transfer start request is issued in the first communication terminal 101 (step S201). For example, the data transfer start request may be triggered by an application that is executed on the host system 104 of the first communication terminal 101 or may be triggered by detecting radio waves from the second communication terminal 106. When the data transfer start request is issued, the first communication terminal 101 transmits a communication start request to the second communication terminal 106 (step S202). When receiving the communication start request from the first communication terminal 101, the second communication terminal 106 transmits a communication start response to the first communication terminal 101 if a state in which data can be transmitted and received is set (step S203). The first communication terminal 101 confirms that the second communication terminal 106 is communicable by receiving a communication start response from the second communication terminal 106.

The first communication terminal 101 that has received the communication start response from the second communication terminal 106 transmits information indicating the size or amount of data to be transferred (referred to as transfer data size) as the transfer data size notification to the second communication terminal 106 (step S204). The transfer data size indicates the size or amount of data to be transferred in later step S206 and, for example, the bit count, byte count, packet count or the like can be used as the unit. The second communication terminal 106 receives the transfer data size notification and then determines whether the transfer data size is not larger than a predetermined threshold value. In the present embodiment, it is assuming that the second communication terminal 106 determines that the transfer data size is not larger than the threshold value. The second communication terminal 106 transmits transfer data size confirmation indicating that the transfer data size notification is received to the first communication terminal 101 independently of comparison of the transfer data size and the threshold value (step S205).

After receiving the transfer data size confirmation, the first communication terminal 101 transmits data with the size that is notified in step S204 as a data signal to the second communication terminal 106 (step S206). Data transferred by the first communication terminal 101 may be transferred by use of one packet (or frame) or may be divided into a plurality of packets (or frames) and transferred. When data is divided into a plurality of packets (or frames) and transferred, the total sum of the sizes of data items included in the respective packets is notified to the second communication terminal 106 by use of the above transfer data size notification. One packet (or frame) corresponds to a data signal.

The second communication terminal 106 receives a data signal from the first communication terminal 101 and obtains received data by subjecting the data signal to signal processing. The second communication terminal 106 writes the received data to the temporary area of the memory 110. If a data signal is successfully received, the second communication terminal 106 transmits, to the first communication terminal 101, an ACK packet (or ACK frame) as a reception confirmation response (step S207). If data is divided into packets (or frames) and transferred, data transfer shown in step S206 and return of ACK shown in step S207 are repeatedly performed. The first communication terminal 101 receives the ACK packet (or ACK frame) from the second communication terminal 106 to confirm that data transfer is successfully performed.

When data transfer is terminated, the first communication terminal 101 transmits a communication end notification to the second communication terminal 106 (step S208). When receiving the communication end notification, the second communication terminal 106 recognizes that data transfer by the first communication terminal 101 is completed. After data transfer by the first communication terminal 101 is completed, the received data stored in the temporary area is copied to the data area in the second communication terminal 106 (step S209). After the copy process is completed in the second communication terminal 106, the received data in the temporary area is erased (step S210).

The transfer data size notification shown in step S204 is explained to be transmitted after the communication start response in step S203, but it is not limited to this case and if the size of data to be transferred is known at the communication start time, the notification may be included in a communication start request. When the transfer data size notification is included in the communication start request, a communication start response transmitted from the second communication terminal 106 may include transfer data size confirmation that is a response with respect to the transfer data size notification. Therefore, the transfer data size notification in step S204 and the transfer data size confirmation in step S205 can be omitted.

Further, as another example in which the size of data to be transferred is notified, information indicating the size of data to be transferred is included in header information of a packet (or frame) transferred in step S206. When the transfer data size notification is included in header information of a packet (or frame) transferred, transfer data size confirmation will be included in an ACK packet (or ACK frame) transmitted in step S207. Therefore, also, in this example, the transfer data size notification in step S204 and the transfer data size confirmation in step S205 can be omitted.

FIG. 3A schematically shows the configuration of the memory 110 in the second communication terminal 106. As shown in FIG. 3A, the memory 110 includes a data area 301 that stores data (or file) and a temporary area 302 functioning as a buffer. The data area 301 and temporary area 302 are partitioned or divided by using a logical address. The logical address is an address used when the host system 109 accesses the memory 110.

The data area 301 includes a file system area 303 that stores a file system. The file system records control information used for controlling a file and folder in the data area 301 and controls the file and folder stored in the data area 301 by using the control information. A data recording method for the memory 110, an access method with respect to the file and folder and the like are determined in the file system. The data area 301 is an area in which the file and folder are controlled by the file system. The temporary area 302 is not controlled by the file system or is beyond control of the file system. Therefore, for example, an application executed on the host system 109 to access the memory 110 via the file system cannot access the temporary area 302.

The memory 110 of the present embodiment is, for example, a NAND flash memory. In the NAND flash memory, data writing and reading are performed in a page unit and data erase is performed in a block unit, where a page is formed by a plurality of memory cells and a block is formed by a plurality of pages. Each of the data area 301 and temporary area 302 includes a plurality of blocks. In FIG. 3A, one square box indicates one block. Unique physical addresses are allocated to respective pages. Alternatively, the physical addresses may be allocated to respective blocks.

In the NAND flash memory, it is impossible to overwrite data in the block that is already written. Therefore, when data is overwritten in the block that is already written, new data is written after data in the block is erased. Further, when a portion of data stored in the block is rewritten, new data to be rewritten is written to another block that has already been erased and the other portion of the data stored in the block, which is not rewritten, is copied to the other block. Generally, in the NAND flash memory, overhead occurs because of erasing of data and copying of data in the block, and therefore the data writing speed is lowered. In the present embodiment, since data received from the first communication terminal 101 is stored in the temporary area 302 that has already been erased, overhead due to erasing of data and copying of data in the block does not occur and data received at the second communication terminal 106 is instantly written to the memory 110. Therefore, a temporary buffer (not shown) provided in the second communication terminal 106 to wait for erasing of the memory 110 can be made small.

The memory 110 is not limited to the NAND flash memory and can be any type of nonvolatile memory if the memory is a memory in which data of an area having data written therein is required to be erased when data is overwritten in the area.

Next, the operation example of the memory 110 is explained with reference to FIG. 3A to FIG. 3D.

As shown in FIG. 3A, the temporary area 302 in the memory 110 is kept set in an erased state to make preparations for reception of data. As shown in FIG. 3B, data received at the second communication terminal 106 is written to the temporary area 302 without accessing the file system. In this example, it is supposed that it is ensured that the transfer data size is smaller than the size of the temporary area 302 based on previous transfer data size notification. As shown in FIG. 3C, the received data stored in the temporary area 302 is copied to an appropriate address (for example, preset folder, route folder or the like) of the data area 301 according to information of the file system after a series of data receptions is completed. At this time, if the memory is a memory in which data cannot be overwritten in an area having data already written therein like the flash memory, the received data is written after data in an address (that is, block) to which the received data is written is erased. After copying of the received data from the temporary area 302 to the data area 301 is completed, as shown in FIG. 3D, the received data stored in the temporary area 302 is erased to make preparations for next data reception.

In the above method, as shown in FIG. 3C, the received data is copied from the temporary area 302 in which the logical address is fixed to the data area 301, but the process is not limited to this case. By converting the logical address, the temporary area 302 to which the received data is written may be changed to the data area 301 and an unused area of the data area 301 may be changed to the temporary area 302. The unused area is an area in which data is erased. Thus, data in the temporary area 302 can be erased by exchanging logical addresses between the data area 301 and the unused area of the data area 301 or by exchanging the logical address allocated to the temporary area 302 for the logical address allocated to the unused area of the data area 301. Thus in the above method if it is determined that the size of the data is not larger than the threshold value, the received data is written to the temporary area 302, and logical addresses are exchanged between the temporary area 302 and an unused area of the data area 301 after completion of reception.

FIG. 4 more specifically shows the configuration of the communication terminal 106 according to the present embodiment. As shown in FIG. 4, the second communication terminal 106 includes the communication/storage unit 111 with a wireless communication function and data storage function, the antenna 108, and the host system 109. The antenna 108 may be included in the communication/storage unit 111.

The communication/storage unit 111 includes a CPU 401, the memory 110 corresponding to a data storage device, a memory control unit 402, a data size determination unit 403, a radio-frequency (RF) circuit 404, a communication circuit 405 and a host interface 406. The respective modules or units are connected to one another via a data bus 407. The communication modem 107 shown in FIG. 1 includes the CPU 401, the memory control unit 402, the data size determination unit 403, the RF circuit 404, and the communication circuit 405. The RF circuit 404 and communication circuit 405 are operated as the reception unit of the second communication terminal 106.

The communication/storage unit 111 is connected to the host system 109 via the host interface 406. The host interface 406 exchanges data with the host system 109.

The CPU (also referred to as a control unit) 401 reads a control program stored in a ROM (not shown) and controls the operations of the respective modules according to the control program. Further, the CPU 401 writes data received from the first communication terminal 101 to the memory 110 via the memory control unit 402. For example, if the size of data transferred from the first communication terminal 101 is not larger than a predetermined threshold value, the CPU 401 writes the data received from the first communication terminal 101 to the temporary area 302 of the memory 110, reads the received data stored in the temporary area 302 of the memory 110, writes the received data to the data area 301 of the memory 110, and then erases the received data in the temporary area 302 of the memory 110.

The communication circuit 405 performs signal processing for converting an analog signal to a digital signal, converting a digital signal to an analog signal and the like. The communication circuit 405 includes a temporary buffer (not shown) used for busy waiting of the data bus 407. The RF circuit 404 performs frequency conversion and amplification for wireless communication. The antenna 108 receives radio waves from the first communication terminal 101 to obtain a received signal. The received signal is filtered, amplified and down-converted by the RF circuit 404 and converted to a digital signal by the communication circuit 405. If the received signal is data, communication start request or communication end notification, the communication circuit 405 passes the received signal to the CPU 401. If the received signal is a transfer data size notification, the communication circuit 405 passes the received signal to the data size determination unit 403. Thus, the communication circuit 405 passes the communication start request to notify the CPU 401 about the presence of another communication partner (for example, first communication terminal 101). As a result, the CPU 401 recognizes that data transfer by the first communication terminal 101 is started. The communication start request may be issued by the host system 109 and notified from the host system 109 to the CPU 401 via the host interface 406.

A signal or message (for example, communication start response, transfer data size response, ACK packet or the like) to be transmitted to the first communication terminal 101 is generated by the CPU 401 or the like. The message generated by the CPU 401 is converted to an analog signal by the communication circuit 405, up-converted, amplified and filtered by the RF circuit 404 and then transmitted as radio waves from the antenna 108.

The memory control unit 402 converts a logical address specified by the host system 109 or CPU 401 to a corresponding physical address when data is written to or read from the memory 110. Further, the memory control unit 402 performs error correction coding and decoding and the like with respect to data to be transmitted and received. The data size determination unit 403 determines whether the size of data to be received is not larger than a predetermined threshold value, based on the transfer data size notification received from the first communication terminal 101, and notifies the CPU 401 about the determination result. The threshold value is preferably set to the same value as the size (or capacity) of the temporary area 302 of the memory 110, but may be set to a value smaller than the size of the temporary area 302. If it is determined that the size of data to be received is not larger than the threshold value, the CPU 401 temporarily records data received from the first communication terminal 101 in the temporary area 302 of the memory 110.

The data size determination unit 403 is shown as a hardware module in FIG. 4, but the unit is not limited to this case, and may be software executed on the CPU 401.

FIG. 5 shows one example of a procedure for receiving data in the communication terminal according to the present embodiment. First, the communication start process is performed (step S501). Specifically, as shown in step S202 and step S203 of FIG. 2, the second communication terminal 106 receives a communication start request from the first communication terminal 101 and transmits a communication start response to the first communication terminal 101 in response to the request. Next, the transfer data size confirmation process is performed (step S502). Specifically, as shown in step S204 and step S205 of FIG. 2, the second communication terminal 106 receives a transfer data size notification from the first communication terminal 101, confirms the size of data to be received, and transmits transfer data size confirmation to the first communication terminal 101.

Next, the data size determination unit 403 determines whether the size of data to be transferred from the first communication terminal 101 is not larger than the threshold value (step S503). The size of data to be transferred is obtained from the first communication terminal 101 by use of the transfer data size notification in step S204.

If it is determined by the data size determination unit 403 that the size of transfer data is not larger than the threshold value in step S503, the process proceeds to step S504. The data received at the second communication terminal 106 is written to the temporary area 302 of the memory 110 (step S504). Then, it is determined whether or not data reception is correctly completed (step S505). As the determination method, it is possible to use a method for determining that reception is completed when the total sum of received data items becomes equal to the transfer data size determined based on the transfer data size notification, a method for determining that reception is completed by receiving a communication completion notification transmitted from a partner terminal, or the like. If data reception is not correctly completed, the process proceeds to step S507 and an erase process for the temporary area 302 is performed to discard the received data stored in the temporary area (step S507). If data reception is correctly completed, the process proceeds to step S506 and the received data written to the temporary area 302 is copied to a folder in the data area 301 according to information of the file system (step S506). After completion of the copy process, the received data in the temporary area 302 is erased (step S507), and then a series of reception processes is terminated.

If it is determined in step S503 that the transfer data size is larger than the threshold value, the process proceeds to step S508 and data received at the second communication terminal 106 is written to the data area 301 of the memory 110 (step S508).

As described above, the communication device according to the first embodiment writes the received data obtained by data communication to the temporary area in the memory, without performing the erase process and accessing the file system. Therefore, the latency for memory writing can be reduced and the received data can be recorded on the memory at high speed. As a result, the temporary buffer used for waiting for erasing of the memory can be made small to attain a reduction in the circuit size, low cost and low power consumption.

(Second Embodiment)

A communication terminal according to a second embodiment has the same configuration as the communication terminal 106 shown in FIG. 4. In the second embodiment, when the size of data to be received from another communication terminal (for example, first communication terminal 101) exceeds the size of a temporary area allocated to the memory, the temporary area is used as explained below with reference to FIG. 6.

FIG. 6 shows one example of a procedure for receiving data in the communication terminal according to the second embodiment. In FIG. 6, the same reference numbers as those of FIG. 5 are attached to the same portions and the explanation thereof is omitted. A method shown in FIG. 6 is different from the procedure of FIG. 5 in the operation performed when the transfer data size is larger than a predetermined threshold value.

If it is determined in step S503 that the transfer data size is larger than a threshold value, the process proceeds to step S608. The received data is written to a temporary area 302 (step S608). Next, it is determined whether or not the received data has reached the size (or capacity) of the temporary area 302 (step S609). Alternatively, in step S609, the data size determination unit 403 may determine whether or not the received data has reached a threshold value, and the threshold value is set to a value that is not larger than the size of the temporary area 302. If the received data has reached the size of the temporary area 302, the second communication terminal 106 requests the first communication terminal 101 to temporarily stop transmission of data (step S610). For example, the request is included in an ACK package and transmitted. Next, the received data stored in the temporary area 302 is copied to a data area 301 according to information of the file system (step S611). After the copy process is completed, the received data in the temporary area 302 is erased (step S612). After the data in the temporary area 302 is erased, the second communication terminal 106 requests the first communication terminal 101 to restart data transfer (step S613). When receiving a data transfer restart request, the first communication terminal 101 restarts data transfer. When data transfer is restarted, the process returns to step S608. The received data is written to the temporary area 302 (step S608). When the received data has reached the size or capacity of the temporary area 302 again, the operation of step S610 to step S613 is repeatedly performed. When the second communication terminal receives a communication end notification as shown in step S208 of FIG. 2 to terminate the communication, the process proceeds to step S505.

Thus, in the communication terminal 106 according to the present embodiment, the temporary area 302 is utilized for receiving data even when the transfer data size exceeds the size of the temporary area 302 of the memory 110.

As described above, in the communication device according to the second embodiment, data can be recorded on the memory at high speed even when the transfer data size is not greater than the size of the temporary area allocated to the memory.

According to at least one of the embodiments described above, data can be received at high speed while suppressing the circuit size to the small size. At least one of the embodiments can be applied to a wireless communication device that realizes high-speed data communication.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication device comprising:
   a reception unit configured to receive, from another communication device, data and information indicating a size of the data;
   a data storage device comprising a data area controlled by a file system and a temporary area which is beyond control of the file system, the temporary area being allocated a fixed logical address;
   a determination unit configured to determine whether the size of the data is not larger than a predetermined threshold value; and
   a control unit configured to, if it is determined that the size of the data is not larger than the threshold value, write the received data to the temporary area, copy the received data in the temporary area to the data area after completion of reception, and erase the received data in the temporary area after copying.

2. The device according to claim 1, wherein the information is included in a message which requests start of communication.

3. The device according to claim 1, wherein the information is included in a header of a data packet.

4. The device according to claim 1, wherein the control unit writes the received data to the data area if it is determined that the size of the data is greater than the threshold value.

5. The device according to claim 1, wherein the threshold value is equal to a size of the temporary area.

6. A communication device comprising:
   a reception unit configured to receive, from another communication device, data and information indicating a size of the data;
   a data storage device comprising a data area controlled by a file system and a temporary area which is beyond control of the file system;
   a determination unit configured to determine whether the size of the data is not larger than a predetermined threshold value; and
   a control unit configured to, if it is determined that the size of the data is not larger than the threshold value, write the received data to the temporary area, and exchange logical addresses between the temporary area and an unused area of the data area after completion of reception.

7. The device according to claim 6, wherein the information is included in a message which requests start of communication.

8. The device according to claim 6, wherein the information is included in a header of a data packet.

9. The device according to claim 6, wherein the control unit writes the received data to the data area if it is determined that the size of the data is greater than the threshold value.

10. The device according to claim 6, wherein the threshold value is equal to a size of the temporary area.

\* \* \* \* \*